United States Patent [19]
Brummel

[11] Patent Number: 5,771,241
[45] Date of Patent: Jun. 23, 1998

[54] METHOD AND APPARATUS FOR EMBEDDING OPERAND SYNTHESIZING SEQUENCES IN RANDOMLY GENERATED TESTS

[75] Inventor: Karl Brummel, Fort Collins, Colo.

[73] Assignee: Hewlett-Packard Company, Palo Alto,, Calif.

[21] Appl. No.: 741,483

[22] Filed: Oct. 30, 1996

[51] Int. Cl.[6] .................................................. G06F 11/00
[52] U.S. Cl. ............................................................ 371/22.5
[58] Field of Search ................................. 371/22.5, 22.1, 371/22.6, 25.1, 27; 395/183.04, 183.05, 183.6, 183.11

[56] References Cited

U.S. PATENT DOCUMENTS 4,611,320  9/1986  Southard .................................... 371/20
5,646,949  7/1997  Bruce, Jr. et al. ........................ 371/27

*Primary Examiner*—Vincent P. Canney

[57] ABSTRACT

In a conventional random test generator, instructions are generated, pushed onto a queue, and then popped off of the queue in generation order. The methods and apparatus disclosed herein provide a means of associating a delay with each generated instruction. Instructions are therefore popped off of the queue in response to their associated delay, rather than in generation order. Since the delay associated with each instruction of a synthesizing sequence (e.g., a load sequence) is randomly generated, a synthesizing sequence may be generated numerous times, yet never appear as the same sequence of instructions to a device under test. Furthermore, no register is reserved for a special purpose. As a result, the disadvantages of conventional instruction generating techniques are overcome.

21 Claims, 8 Drawing Sheets

```
//----------------------------------------
// flexqueue.h
//----------------------------------------
#ifndef INKLUDGED_FLEXQUEUE_H
#define INKLUDGED_FLEXQUEUE_H
//----------------------------------------
class FlexQueue          ← 802
{
public:
    FlexQueue();
    ~FlexQueue();
    void reset();                            // Hammer the queue to an empty state.
    void push(unsigned val, int delay = 0);  // Push an element.        ← 806
    unsigned pop();                          // Pop an element.
    int empty() const;                       // Head pointer ready to pop.
    int size() const;                        // Number of elements.
private: // You don't need to know...
    struct Element {
        unsigned data;        // Actual value of this element.
        int delay;            // Delay associated with this element.
        Element *next;        // Pointer to the next element in list.
    } *head, *freelist;       // Count of elements in pending list.
          ↑
         804
    int count;
};
//----------------------------------------
#endif // INKLUDGED_FLEXQUEUE_H
```

```
//-----------------------------------------------------------
/// flexqueue.C: Queue objects for polyphony.
//----------------------------------------------------------- include <stdlib.h>
include "flexqueue.h"

//-----------------------------------------------------------
/// Constructor: how to create a Flexqueue. Initializes the pending list
/// and free list to indicate they are empty, and set the count of pending
/// elements to zero.
//-----------------------------------------------------------
FlexQueue::FlexQueue()            ← 902
{
head = freelist = NULL;
count = 0;          ← 906
}

//-----------------------------------------------------------
/// Destructor: how to reclaim memory allocated by a FlexQueue.
/// Deallocate memory consumed by the elements on the pending list and the
/// free list.
//-----------------------------------------------------------
FlexQueue::~FlexQueue()
{
Element *e;
while (head) {
        e = head;
        head = e->next;
        delete e;
        }
while (freelist){
        e = freelist;
        freelist = freelist->next;
        delete e;
        }
}
```
↑ 904

FIG. 9

```
//-----------------------------------------------------------
// Reset function, used to effectively empty the queue. This is done by
// tacking the pending list onto the free list, and setting the pending
// list pointer to NULL.  Hammer the count of pending elements to zero.

void FlexQueue::reset()            ── 1002
{
    // If the queue is not empty, add the linked list to the freelist.
    if (head == NULL) return;
    for (Element *e = head; e->next; e = e->next);
    e->next = freelist;
    freelist = head;
    head = NULL;
    count = 0;
}
```

```
// -------------------------------------------
// Push a value with an optional delay (the delay parameter defaults to
// zero.) This takes an element from the free list, or allocates a new
// element if the freelist is empty, and inserts it in the pending list at
// the proper position, depending on age and delay.

void FlexQueue::push(unsigned value, int delay)
{                                    1102
Element *e;
if(freelist == NULL) e = new Element;
else {
        e = freelist;
        freelist = freelist->next;
        }
e->data = value;
e->delay = delay;
// If 1. The delay of the new element is zero, 2. the pending list is empty,
// or 3. the delay of the first element in the pending list is greater than
// the delay of the new element, insert the new element at the front of the
// pending list
if (delay == 0 || head == NULL || head->delay >= delay) {
        e->next = head;
        head = e;
        }
// Otherwise, walk down the list until we reach the end, or the delay of the
// next element is greater than the delay of the new element, and put the
// new element there.
else for(Element *t = head; t; t = t->next) {
        Element *tnext = t->next;
        if (tnext == NULL || tnext->delay >= delay) {
                e->next = tnext;
                t->next = e;
                break;
                }
        }
// Add one to the count of pending elements.
++count;
}
```

```
//---------------------------------------------------------
/// Return the first value in the queue. Move the first element from the
/// pending list to the free list. Then walk down the pending list,
/// subtracting one from each delay.
unsigned FlexQueue::pop()      ← 1202
{
// Probably should call abort() or something drastic.
if (head == NULL) return 0;

Element *e = head;
unsigned rval = head->data;
head = head->next;
e->next = freelist;
freelist = e;
for (e = head; e; e = e->next) --(e->delay);
--count;
return rval;
}

//---------------------------------------------------------
/// If the pending list is empty, or the delay of the first pending element
/// is greater than zero, the queue appears empty.
int FlexQueue::empty() const      ← 1204
{
return (head == NULL || head->delay > 0);
}

//---------------------------------------------------------
/// Return a simple count of the elements in the pending list.
int FlexQueue::size() const      ← 1206
{
return count;
}
//---------------------------------------------------------
```

METHOD AND APPARATUS FOR EMBEDDING OPERAND SYNTHESIZING SEQUENCES IN RANDOMLY GENERATED TESTS

FIELD OF THE INVENTION

The invention pertains to computer implemented methods and apparatus for embedding one or more operand synthesizing sequences in a randomly generated test. More particularly, the invention pertains to a flexible queue which enables the synthesis of useful operands during the simulation (or execution) of a randomly generated test.

BACKGROUND OF THE INVENTION

A random test generator (also known as a "random vector generator" or "random code generator") is often used to verify the operation of a processor. Such a generator randomly generates tests comprising add, load, store, and system configuration instructions. These tests tend to exercise a processor's control paths more fully than typical program code, which for performance reasons often deliberately avoids doing things which it is known are difficult for a processor to do.

Typically, a random test generator comprises a generator and a simulator. The generator computes the initial state for a device under test (DUT), loads that state into a simulator, and then enters a main loop. The DUT may be a model of a processor or a processor prototype (i.e., prototype silicon).

In its main loop, the generator generates random instruction(s), loads them into a simulator's memory, and then causes the instruction(s) to be simulated. The simulator, which may be integrated into the generator or provided by some other means, provides an architectural model of the DUT, and allows the generator to track the architecturally visible state of the DUT and respond appropriately as instructions are generated and simulated.

When a sufficient number of instructions have been generated, the generator exits its main loop. At this point, the generator will have created a "testcase", which comprises both an initial state (in the case of a microprocessor, this initial state comprises values for register files, translation lookaside buffers (TLBs), caches, memory, etc.) and an expected final state (obtained from the simulator) for a DUT.

After compiling a testcase, the initial state of the testcase is loaded onto a DUT and a test is launched. When the test is completed, the resulting state of the DUT is compared against that of the testcase's expected final state, and discrepancies are flagged as errors.

An engineer asserts a certain degree of control over a generator's actions by providing the generator with a configuration file. The programmable configuration file is used to indicate types and frequencies of instructions to be generated, data reference locations, etc.

Although randomly generated tests are very useful in exercising a DUT, certain tests may be skewed away from their intended focus if their instructions cannot consume specific values (sometimes referred to herein as "useful data" or "useful operands").

For example, an engineer may wish to test whether a processor correctly responds to changes in system configuration registers. Because such registers are often privileged (i.e., only usable by operating system code), it is assumed that a programmer understands the ramifications of writing an invalid configuration value into one of these registers, and will not do so. However, random test generators, which typically generate random values that are useless for configuration purposes, must somehow test the DUT's response to changes in configuration. Writing a random value to a configuration register may result in undesirable behavior (i.e., an exception or unpredictable behavior), and cause a test to become erroneous and useless.

Also by way of example, an engineer may wish to generate specific memory addresses for register loads and stores (data references). Careful selection of these addresses is required to fully exercise the features of a processor's memory hierarchy. The generation of entirely random values for these addresses may skew a test away from exercising a memory hierarchy's features.

A variety of techniques have been developed to deal with a random test generator's inability to generate specific values. For example, one conventional technique comprises initializing one or more registers with specific values. However, after doing so, the one or more initialized registers cannot be overwritten and are essentially "used up". As a result, these registers cannot be fully exercised by a random test generator (e.g., the generation of a value cannot interact with consumption of the value). Furthermore, the existence of useful data throughout the duration of a test can preempt the occurrence of certain events (e.g., a bypass).

Another conventional technique for loading useful data into a processor comprises loading data into a register just prior to a point in a test wherein the data is needed. This technique dispenses with a need to dedicate certain registers to the storage of useful data, and allows all registers to be fully exercised. However, a down side of this technique is that one or more load sequences (e.g., "direct loads" or "load immediates") must be repeatedly initiated. Even the simplest load sequences comprise three to six instructions. When these three to six instructions are issued repeatedly, and simulated in generation order, a randomly generated test quickly becomes highly structured and ordered, once again leading to a less than optimum exercise of processor control paths. For example, consider a test wherein a specific value must be loaded into memory after the execution of every tenth instruction. The repetitive issuance of a three instruction load sequence (sometimes referred to herein as a type of "synthesizing sequence") leads to redundancies in 30% of a test's code. In addition to the code redundancy, the repeated use of a single pattern has a calming effect on a test, allowing a DUT to settle down while the value is being synthesized.

The inadequacies of the above techniques are becoming evermore apparent with the advent of superscalar RISC (reduced instruction set computer) processors. For example, in the past, a two way superscalar microprocessor might have had a five stage pipeline with up to ten instructions in the process of execution ("in flight") at any given instant. Such a processor could be exercised with tests of forty to fifty instructions. Current superscalar, out of order execution processors may have fifty or more instructions in flight. This greatly increases the necessary lengths of tests. In recent tests of Hewlett Packard's PA-RISC microprocessor architecture, tests of 150–400 instructions were common, and some tests exceeded 1000 instructions in length. Due to the high number of instructions being generated in such tests, useful data is consumed rather quickly, and either 1) many instructions of a test do not have access to useful data and are merely wasted, or 2) numerous repetitions of a synthesizing sequence are repeated in an effort to continually generate useful data (thereby eliminating much of the test's randomness).

It is therefore a primary object of this invention to provide a flexible queue which enables the synthesis of useful operands in randomly generated tests.

It is a further object of this invention to provide a means for embedding synthesizing sequences in randomly generated tests.

It is yet another object of this invention to provide methods and apparatus which fully exercise and test of all of a processor's control paths.

SUMMARY OF THE INVENTION

In the achievement of the foregoing objects, the inventor has devised a flexible queue which enables the synthesis of useful operands in randomly generated microprocessor tests.

As used herein, a queue is defined as comprising an instruction list, plus all of the functions used to manipulate the instruction list; an instruction list is defined as the data component of a queue; and an instruction is defined as a string of data bits which may be consumed by a microprocessor.

In a conventional random test generator, instructions are generated, and then pushed onto a queue in generation order. The following methods and apparatus describe a means of associating a delay with each generated instruction. Instructions are therefore popped off the queue in conformance with their associated delay, rather than in generation order. In this manner, three instructions corresponding to a synthesizing sequence (perhaps a load) might be associated with delays of zero, three and seven. As a result, the first instruction may be immediately popped from the queue and consumed. The second instruction is not popped from the queue until the first instruction and two "other instructions" have been popped from the queue and consumed. The third instruction is not popped from the queue until the first instruction, two "other instructions", the second instruction, and an additional three "other instructions" have been popped from the queue and consumed. The "other instructions" may be any instructions generated by the random test generator after, and without knowledge of, the instructions comprising the synthesizing sequence (which have already been pushed onto the queue).

It should be noted that this method is not the same as storing instructions of the synthesizing sequence in memory addresses M[PC], M[PC+3], and M[PC+7] (where PC is some base memory address). If this were the case, restrictions would have to be placed on the "other instructions" to ensure that there were no transfers of flow control (e.g., a taken branch or exception), or there would be no guarantee that the synthesizing sequence would be fully executed. The method described herein guarantees that the synthesizing sequence will be executed regardless of flow control changes caused by the "other instructions".

Since the delay associated with each instruction of a synthesizing sequence is randomly generated, the synthesizing sequence may be generated numerous times, yet never appear as the same sequence of instructions to a DUT. Furthermore, no register is reserved for a special purpose. As a result, the disadvantages of conventional instruction generating techniques are overcome.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which:

FIGS. 8–12 illustrate preferred C++ coding for implementing apparatus which embeds synthesizing sequences in randomly generated tests.

DESCRIPTION OF THE PREFERRED EMBODIMENT

Methods 700 and apparatus for embedding synthesizing sequences in randomly generated microprocessor tests, thereby providing for the synthesis of useful operands, are pictured in FIGS. 1–12. In accordance with these figures, and the following description, apparatus for embedding synthesizing sequences in randomly generated tests may comprise one or more computer readable storage mediums, and a body of computer readable program code 800, 900, 1000, 1100, 1200 stored in the one or more computer readable storage mediums. The computer readable program code 800, 900, 1000, 1100, 1200 may comprise a first portion of code for generating and associating a delay for/with each instruction of a randomly generated test. A second portion of the code 1100 may be directed to pushing each instruction of the randomly generated test, along with its associated delay, onto a queue. A third portion of the code 1204 might allow for determining whether an instruction comprising a head element of the queue (i.e., the first element in the queue) has an associated delay which allows it to be presently popped from the queue. A fourth portion of the code 1202 might provide for popping each instruction of the randomly generated test off of the queue.

Also in accordance with FIGS. 1–12 and the following description, a computer implemented method 700 for embedding synthesizing sequences in randomly generated tests and then executing the randomly generated tests in a device under test, may comprise the following steps. A first step 702 comprises generating and associating a delay for/with each instruction of a randomly generated test. A second step 704 comprises pushing each instruction of the randomly generated test, along with its associated delay, onto a queue. A third step 706 comprises determining whether an instruction comprising a head element of the queue has an associated delay which allows it to be presently popped from the queue. A fourth step 708 comprises popping each instruction of the randomly generated test off of the queue. A fifth step 710 comprises executing each instruction popped off of the queue in a device under test. The device under test may be either a pre-silicon model or silicon prototype of a processor. Although the above steps are sequentially numbered, the numbering is not indicative of any kind of execution order.

Having generally described methods 700 and apparatus for embedding synthesizing sequences in randomly generated tests, thereby enabling the synthesis of useful operands during the simulation or execution of a randomly generated test, the methods 700 and apparatus will now be described in further detail.

Figure 1:
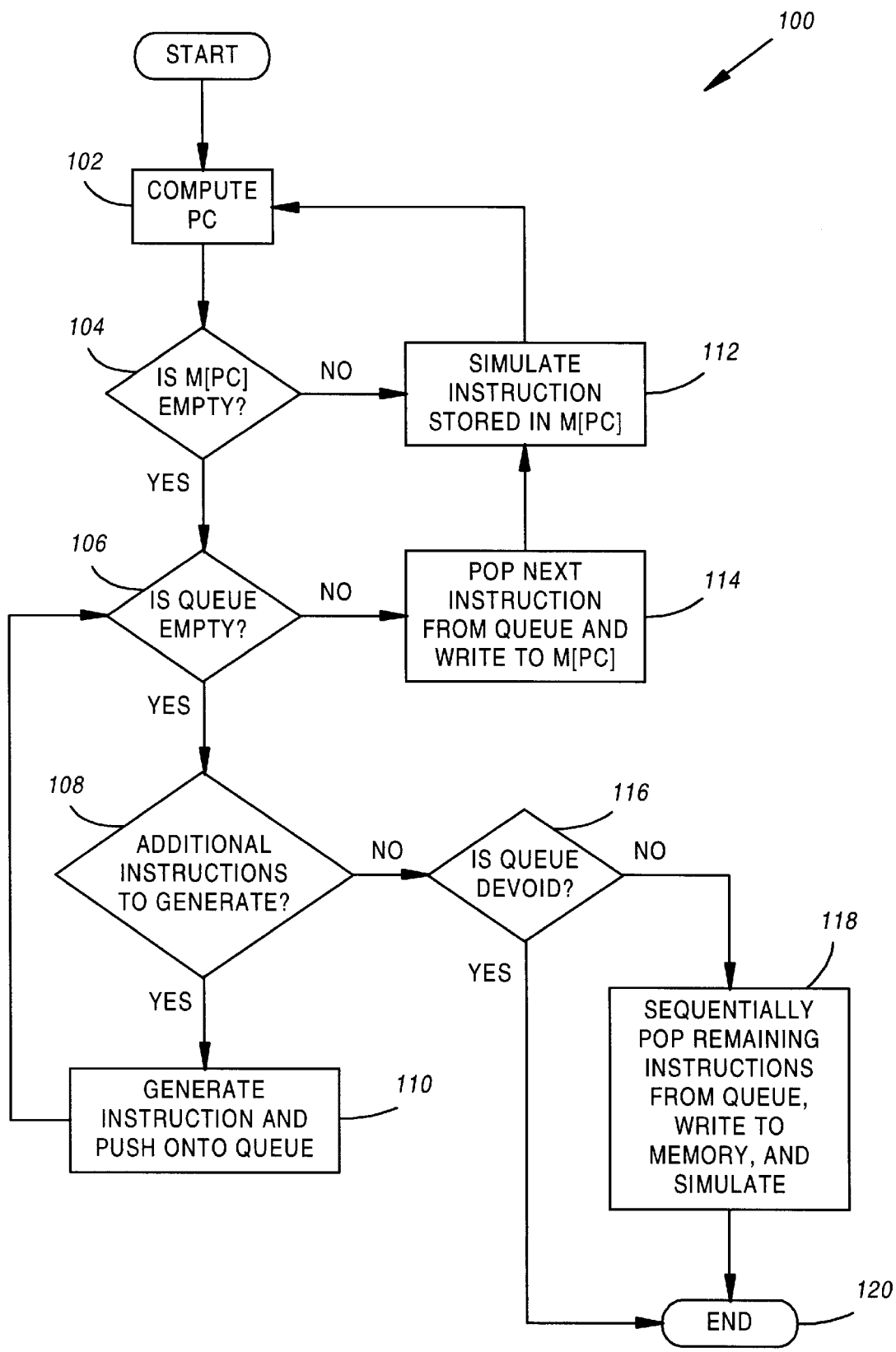
FIG. 1 is a flow chart highlighting the steps performed by a random test generator.

The flow chart 100 of FIG. 1 illustrates steps that might be performed by a random test generator implementing the program code 800, 900, 1000, 1100, 1200 illustrated in FIGS. 8–12. First, the random test generator computes 102 an initial value of the program counter PC. The random test generator then checks 104 the contents of M[PC] (a memory address determined by the value of PC) to determine whether an instruction is currently stored at that address. If an instruction is found at M[PC], the instruction is simulated 112, and the program counter's value is recomputed 102 (e.g., incremented or decremented).

If at some point M[PC] is found to be empty, the random test generator determines 106 whether an instruction can be "popped" from an instruction "queue". If an instruction can be popped, it is popped and written 114 to memory address M[PC], and then simulated 112 within a simulator. If an instruction cannot be popped, and additional instructions remain to be generated 108, one or more additional instructions are generated and pushed 110 onto the queue. The queue is then checked 106 again to determine whether an instruction in the queue can be popped. If not, more instructions are generated and pushed 110 onto the queue. At some point, an instruction is popped 114 from the queue, written 114 to memory, and simulated 112.

If an instruction cannot be popped from the queue, and no additional instructions remain to be generated 108, the queue is checked 116 to determine whether it is devoid of instructions. As defined in this description, a queue is "empty" if an instruction cannot currently be popped from the queue. A queue is "devoid" of instructions if no instructions remain in the queue. As will be further explained later in this description, each instruction in the queue is associated with a delay. In this manner, it is possible that a queue might appear to be "empty" (because no instruction is associated with a delay which is less than or equal to zero), but not be "devoid" of instructions. If the queue is not devoid of instructions, instructions remaining in the queue are sequentially popped 118 from the queue, written 118 to memory, and simulated 118. At this point, the queue will be devoid of instructions, and the generation/simulation will come to an end 120.

As earlier summarized, an instruction queue (as defined herein) comprises a list of pending instructions (data) and all of the functions used to manipulate the list. The queue described herein is prioritized, meaning that instructions are inserted and removed ("pushed" and "popped") from the queue in a predetermined order. By way of example, the C++ computer code of FIGS. 8–12 implements a LIFO (last in first out) queue (denoted in the code as a "flexqueue" 802, 902). However, the queue could also have been implemented as a FIFO (first in first out) queue or other prioritized queue.

A very unique aspect of the flexqueue 802, implemented in FIGS. 8–12 is that each instruction of the queue 802, (or element of the queue) is associated with a delay 804. By default, an instruction is associated with a delay of zero 806 and then pushed onto the queue 802. If two or more instructions are pushed onto the queue 802 with associated delays which differ, they will be prioritized within the queue 802 so that the instruction associated with least delay will be popped from the queue 802 prior to the instruction or instructions associated with greater delays. If two or more randomly generated instructions are simultaneously pushed onto the queue 802 with identical delays, they will be prioritized based on their age (i.e., in a LIFO queue, the instruction which was generated last will be given a priority within the queue 802 which causes it to be popped from the queue 802 before the instruction which was generated first).

The flexqueue 802 of FIGS. 8–12 is implemented as a number of elements 202–208 comprising a list of pending instructions 200, wherein each element 202–208 of the list 200 (but for the NULL element) comprises a pointer 210–214 to a "next" element in the list. See, for example, elements A 202, B 204 and C 206 of FIG. 2. In this manner, an element which is next in line to be popped from the queue 802 may be designated as the "head element" 202. The head element 202 points to an element 204 which is next in the pending instruction list 200, and so on. A NULL element 208 designates the end of the pending instruction list 200, and when encountered, signals that there are no more instructions to be popped from the queue 802.

Figure 2:
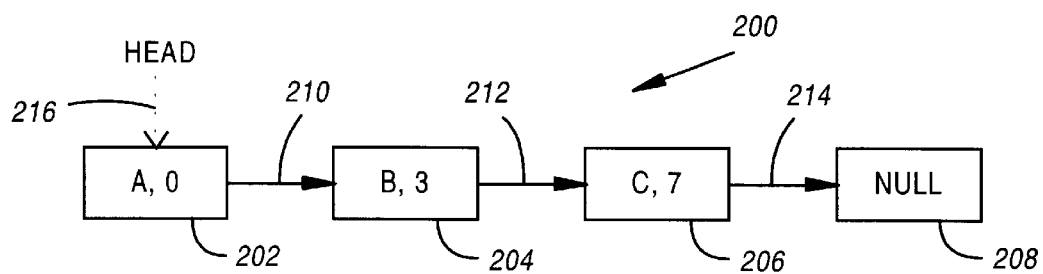
FIG. 2 illustrates a first embodiment of an instruction queue.

In FIG. 2, element A 202 is the head element, and is associated with a delay of zero. Element A 202 is followed by elements B 204 and C 206 (with respective delays of three and seven). Bringing up the end of the list is the NULL element 208. Note that each element 202–206, but for the NULL element 208, is associated with a "next" or "child" pointer 210–214.

As additional instructions are pushed onto the queue 802 and added to the list 200, child pointers 210–214 are adjusted accordingly.

EXAMPLE

The operation of the above apparatus and methods 700 may be better understood with respect to the following example.

A C++ implementation of blocks 106, 114, 112 and 110 of the FIG. 1 flow diagram 100 might appear as follows:

```
while (generating)  {
        if (queue->empty() == 0)  {
                inst = queue->pop();
                simulate(inst);
                }
        else generate()
        }
```

Consider the following sequence of PA-RISC instructions, which it might be necessary to consume in sequence order so as to induce the occurrence of a given condition (e.g., load or synthesize a useful operand):

```
            ldil    L%0x000fcda,r1
            ldo     R%0x000fcda,r1,r1
            mtsp    r1,sr1
```

Although these instructions are specific to the PA-RISC microprocessor architecture, other microprocessor architectures require the loading of similar instruction sequences.

At some point during a simulation, the queue 802 from which instructions are being consumed will become empty 1204 (either because the queue 802 is devoid of instructions, or because the queue 802 comprises a head element 202, 904 with other than a zero delay), and the above sequence of instructions will be pushed 1102 onto the queue 802. Given a library function rand(x), which returns a random value between 1 and x, the code which effects this push might appear as:

```
delay = 0;
queue->push("ldil    L%0x000fcda,r1",delay);
```

```
delay = delay + rand(5);
queue->push("ldo    R%0x000fcda,r1,r1",delay);
delay = delay + rand(5);
queue->push("mtsp   r1,sr1",delay);
```

Note that the order of the synthesizing sequence is preserved as the synthesizing sequence is pushed onto the queue. However, if the above code segment were to be executed twice, the first execution might associate delays of zero, four, and six with the pushed instructions, and the second execution might associate the pushed instructions with delays of zero, three, and seven. Also note that the length of the synthesizing sequence (as determined by the delays associated with its instructions) may vary from three to eleven. This presents quite a large number of possible delay combinations. When "other instructions" (i.e., those not forming a part of the recently pushed synthesizing sequence) are pushed onto the queue in between the instructions of a particular synthesizing sequence, a nearly infinite number of synthesizing sequence permutations become possible.

Assuming that the first of the above instructions (instruction A) is pushed onto the queue with an associated delay of zero, the second instruction (instruction B) is pushed on with an associated delay of three, and the third instruction (instruction C) is pushed on with an associated delay of seven, a list 200 of pending elements 202–208 might appear as shown in FIG. 2.

Figure 3:
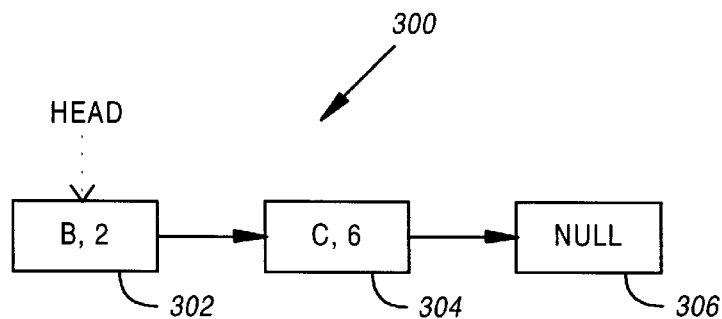
FIG. 3 illustrates a second embodiment of an instruction queue.
Figure 4:
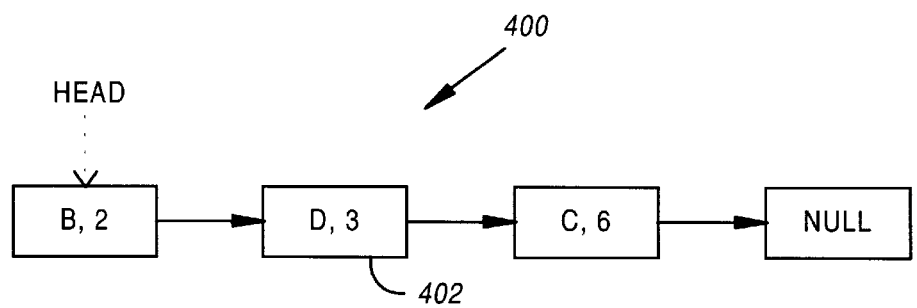
FIG. 4 illustrates a third embodiment of an instruction queue.
Figure 5:
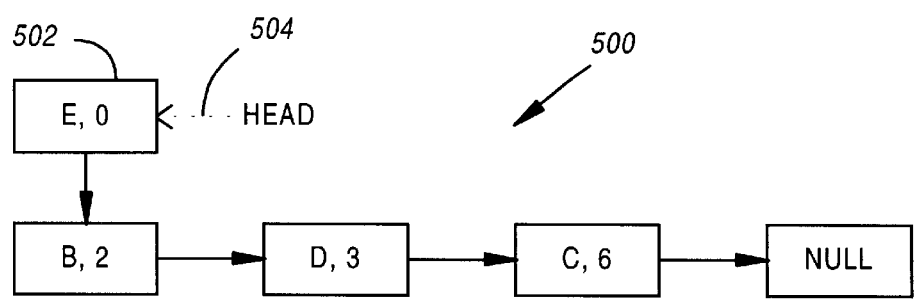
FIG. 5 illustrates a fourth embodiment of an instruction queue.
Figure 6:
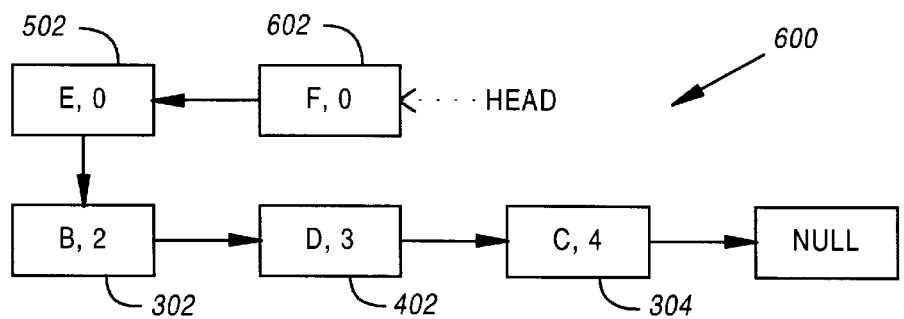
FIG. 6 illustrates a fifth embodiment of an instruction queue.
Figure 7:
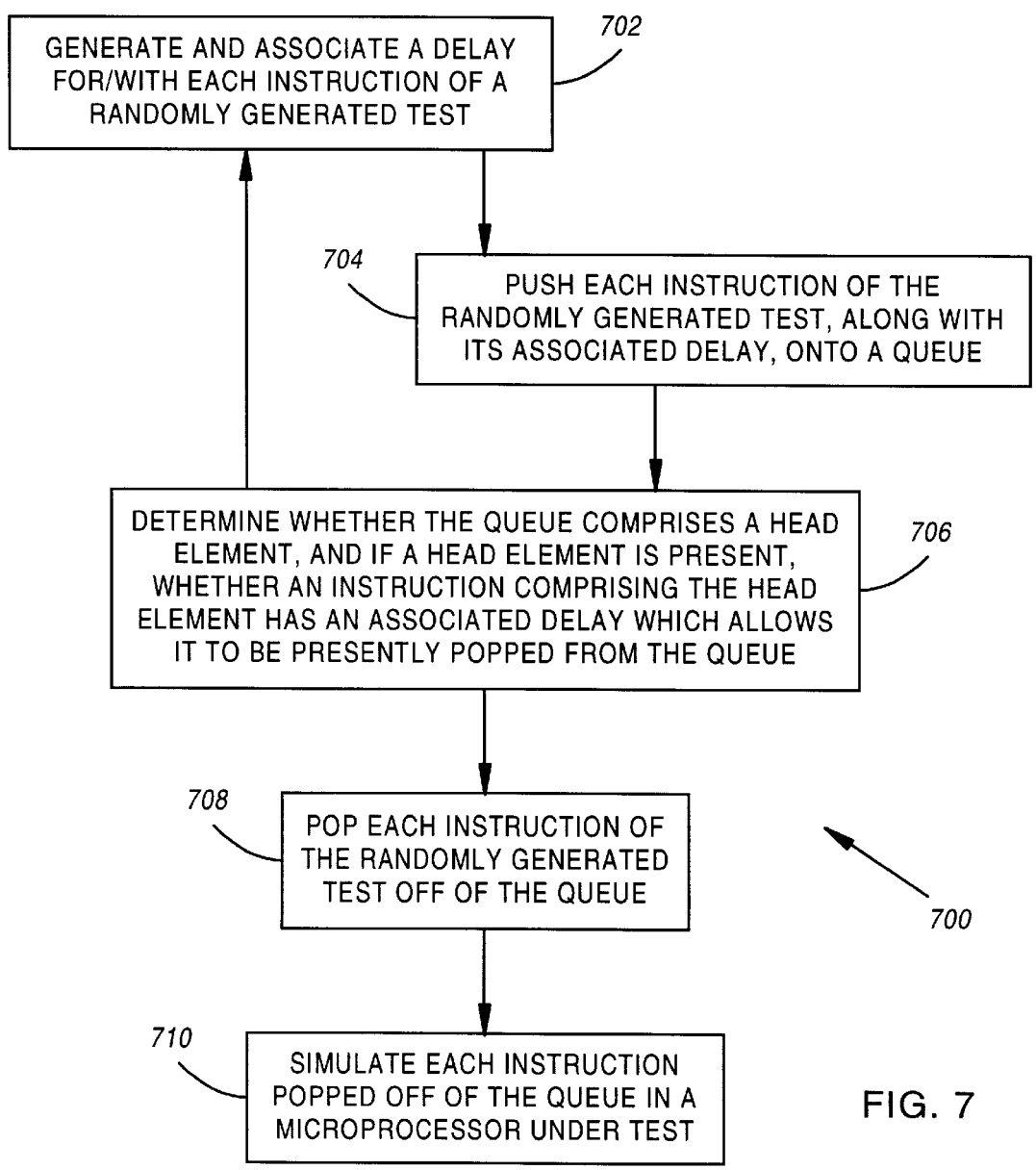
FIG. 7 is a flow chart illustrating a method of embedding synthesizing sequences in randomly generated tests.

Since the first instruction (element A) was pushed onto an empty queue, and is associated with zero delay, it is assigned as the head element 202, and may be immediately popped from the queue 802 and consumed (i.e, stored to memory and then simulated). After its consumption, the head pointer 216 is assigned to the next element 204 of the queue 802, and the list of pending instructions 200 is "walked" (i.e., each element 202–208 is examined in turn). In walking the list 200, the delay associated with each element 202–208 is decremented by one. In this manner, the pending list 300 of FIG. 3 is achieved.

When the above calling routine again checks to see if the queue 802 is empty 1204, it will return a flag indicating that the queue 802 is empty. Although the queue 802 is not devoid of instructions, it appears empty because the head element 302 is associated with a delay which is greater than zero. Additional instructions must therefore be generated and pushed onto the queue 802.

If a next generated instruction is associated with a delay of three, the list of pending instructions 300 will again be walked, and an element (element D 404 in FIG. 4) embodying the new instruction will be inserted into the list in accordance with its associated delay. See FIG. 4. The list 400 may then be checked once again to determine if it is empty, and again, a flag will be returned which indicates that the list 400 is empty.

Now assume that an instruction with an associated delay of zero is generated. This element (element E 502 in FIG. 5) will be inserted at the beginning of the list, and the head pointer 504 will be reassigned to point to the list's new head element 502. See FIG. 5. At this point, element E 502 may be immediately popped from the list. However, assume that another instruction with zero delay (embodied in element F 602) is pushed onto the list at the same time element E 502 is pushed onto the list. See FIG. 6. Since the queue 802 is preferably implemented with LIFO priority, the last instruction to be generated is given priority in the queue 802 based on its age of creation. Assuming that element E 502 is generated first, element F 602 will be pushed onto the queue before element E 502. After element F 602 is popped from the queue, each remaining element 502, 302, 402, 304 will have its associated delay decreased by one, leaving element E 502 with a delay of negative one (−1), and in position to be popped from the queue 802 next since its delay is now less than or equal to zero.

As earlier mentioned, the default delay 806 associated with an instruction is zero. However, an optional delay 804 allows synthesizing sequences to be pushed onto a queue 802 in what appears to a DUT to be an entirely random order (when in fact, the order of a synthesizing sequence is not random, but only appears to be random due to the spacing of its instructions in the queue). In its preferred embodiment, the queue 802 of FIGS. 8–12 associates an integer delay of between zero and eight with each instruction of a synthesizing sequence, and associates a delay of zero with all other instructions. Again, note that even when the same synthesizing sequence is pushed onto the queue 802 with equal amounts of delay separating its instructions, the two synthesizing sequences will appear different to a DUT due to the randomness of instructions pushed onto to the queue "in between" the instructions of the synthesizing sequence. For example, assume that the synthesizing sequence pushed onto the queue 802 in the above example is pushed onto a queue 802 several times, and each time, a delay of three separates the first two instructions, and a delay of two separates the second two instructions. Since additional randomly generated instructions will be pushed onto the queue 802 in between the instructions of the synthesizing sequence, the content of the additional randomly generated instructions insures that repetition of a code segment is highly unlikely.

A simple queue might only comprise a single list (i.e., a list of pending elements 200) wherein elements added to the list must first be created, and elements deleted from the list must be destroyed. However, to save the time of element creation and deletion, an additional list 906 may be maintained within the queue 802. This additional list 906 has been implemented in the code of FIGS. 8–12, and is termed a "freelist". The freelist 906 comprises a number of elements which are invisible to routines which query the pending list (also referred to in the code as a "linked list" 1004). When an element needs to be added to the pending list 1004, an element is merely re-allocated from the freelist 906 to the pending list 1004, and when an element of the pending list 1004 needs to be deleted, it is merely re-allocated to the freelist 906. In this manner, the more time-consuming steps of creating and deleting elements are saved.

Use of a freelist 906 complicates the coding of the queue 802 to a certain degree. However, a random test generator will typically maintain a queue 802 which oscillates around a certain length (probably one pending element), and instructions are therefore pushed onto the queue 802 and immediately popped off. As a result, a freelist 906 imparts a significant performance advantage throughout the majority of a test.

When using both a freelist and pending list, a queue 802 may be reset 1002 by appending its pending list 802 onto its freelist 906.

An additional feature which may be embodied in the above apparatus is a means to flush all instructions out of the queue 802 at the close of a test. For example, consider the existence of a list 300 such as that shown in FIG. 3, and assume that no more instructions remain to be generated. In order to complete a test, the instructions remaining in the queue 802 must be consumed, irregardless of the fact that the queue 802 appears empty. The queue 802 may be emptied by querying it for its size 1206. If its size is other than zero, the delay associated with each element 302, 304 is ignored so that remaining instructions are sequentially popped from the queue 802, stored to memory, and then simulated.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. Apparatus for embedding synthesizing sequences in randomly generated tests, wherein the randomly generated tests may be executed within a device under test, the apparatus comprising:
   a) one or more computer readable storage mediums; and
   b) computer readable program code stored in the one or more computer readable storage mediums, the computer readable program code comprising:
      i) code for generating and associating a delay for/with each instruction of a randomly generated test;
      ii) code for pushing each instruction of the randomly generated test, along with its associated delay, onto a queue;
      iii) code for determining whether an instruction comprising a head element of the queue has an associated delay which allows it to be presently popped from the queue; and
      iv) code for popping each instruction of the randomly generated test off of the queue.

2. Apparatus as in claim 1, wherein the code for generating and associating a delay for/with each instruction of a randomly generated test:
   a) associates specified instructions with a random delay; and
   b) associates all instructions other than the specified instructions with a zero delay.

3. Apparatus as in claim 1, wherein:
   a) the code for generating and associating a delay for/with each instruction of a randomly generated test,
      i) associates a random delay with each instruction of a synthesizing sequence; and
      ii) associates a zero delay with all instructions other than those comprising a synthesizing sequence; and
   b) the code for pushing each instruction of the randomly generated test onto a queue prioritizes the queue so that some instructions, other than those comprising a synthesizing sequence, are pushed onto the queue in between those instructions comprising a synthesizing sequence.

4. Apparatus as in claim 1, wherein the computer readable program code further comprises:
   a) code for constructing and managing a list of pending elements within the queue such that the list of pending elements begins with the head element, and the head element is associated with a delay which is less than or equal to that of other elements in the list of pending elements;
   wherein:
   b) the code for pushing each instruction of the randomly generated test onto a queue comprises code for walking down the list of pending elements and inserting a new element into the list of pending elements, at a point dictated by the new element's associated delay.

5. Apparatus as in claim 4, wherein the point at which a new element is inserted into the list of pending elements, as dictated by the code for inserting a new element into the list of pending elements, may also be dictated by the new element's age.

6. Apparatus as in claim 1, further comprising:
   a) code for constructing and managing a list of pending elements within the queue;
   wherein:
   b) the code for popping each instruction of the randomly generated test off of the queue comprises code for walking down the list of pending elements, after an instruction has been popped off of the queue, and decrementing the delay associated with each element in the list of pending elements.

7. Apparatus as in claim 6, wherein:
   a) the code for constructing and managing the list of pending elements constructs the list of pending elements such that it begins with the head element, and the head element is associated with a delay which is less than or equal to that of other elements in the list of pending elements; and
   c) the code for popping each instruction of the randomly generated test off of the queue comprises:
      i) code for removing the head element from the list of pending elements after an instruction has been popped off of the queue; and
      ii) code for assigning a next element in the list of pending elements as the head element.

8. Apparatus as in claim 1, wherein the code for determining whether an instruction comprising a head element of the queue has an associated delay which allows it to be presently popped from the queue returns a flag indicating that the queue is empty if either of the following conditions is met:
   a) the head element is a NULL element; or
   b) the delay associated with the head element is greater than zero.

9. Apparatus as in claim 1, further comprising code for constructing and managing a list of pending elements within the queue such that each element in the list of pending elements comprises:
   a) an instruction;
   b) a delay associated with the instruction; and
   c) one or more pointers to other elements in the list of pending elements.

10. Apparatus as in claim 1, further comprising code for determining whether the queue comprises elements associated with delays in excess of zero, and thus, whether the queue is devoid of instructions.

11. Apparatus as in claim 10, further comprising code, responsive to data generated by the code for determining whether the queue is devoid of instructions, which adjusts the delay associated with each instruction remaining on the queue so as to insure that instructions remaining on the queue will be sequentially and immediately popped from the queue.

12. A computer implemented method for embedding synthesizing sequences in randomly generated tests and executing the randomly generated tests in a device under test, the method comprising the steps of:
   a) generating and associating a delay for/with each instruction of a randomly generated test;

b) pushing each instruction of the randomly generated test, along with its associated delay, onto a queue;

c) determining whether an instruction comprising a head element of the queue has an associated delay which allows it to be presently popped from the queue;

d) popping each instruction of the randomly generated test off of the queue; and e) executing each instruction popped off of the queue in a device under test.

13. A computer implemented method as in claim 12, wherein the step of generating and associating a delay for/with each instruction of a randomly generated test comprises the steps of:

a) associating a random delay with specified instructions; and b) associating a zero delay with all instructions other than the specified instructions.

14. A computer implemented method as in claim 12, wherein:

a) the step of generating and associating a delay for/with each instruction of a randomly generated test comprises the steps of:
  i) associating a random delay with each instruction of a synthesizing sequence; and
  ii) associating a zero delay with all instructions other than those comprising a synthesizing sequence; and b) the step of pushing each instruction of the randomly generated test onto a queue comprises the step of prioritizing the queue so that some instructions, other than those comprising a synthesizing sequence, are pushed onto the queue in between those instructions comprising a synthesizing sequence.

15. A computer implemented method as in claim 12, further comprising the step of:

a) constructing and managing a list of pending elements within the queue such that the list of pending elements begins with the head element, and the head element is associated with a delay which is less than or equal to that of other elements in the list of pending elements;

wherein:

b) the step of pushing each instruction of the randomly generated test onto a queue comprises the step of walking down the list of pending elements and inserting a new element into the list of pending elements, at a point dictated by the new element's associated delay.

16. A computer implemented method as in claim 15, wherein the step of inserting a new element into the list of pending elements comprises the step of inserting the new element at a point dictated not only by its associated delay, but also by its age.

17. A computer implemented method as in claim 12, further comprising the step of:

a) constructing and managing a list of pending elements within the queue;

wherein:

b) the step of popping each instruction of the randomly generated test off of the queue comprises the step of walking down the list of pending elements, after an instruction has been popped off of the queue, and decrementing the delay associated with each element in the list of pending elements.

18. A computer implemented method as in claim 17, wherein:

a) the step of constructing and managing the list of pending elements comprises constructing the list of pending elements such that:
  i) the list of pending elements begins with the head element; and
  ii) the head element is associated with a delay which is less than or equal to that of other elements in the list of pending elements; and b) the step of popping each instruction of the randomly generated test off of the queue comprises the steps of:
  i) removing the head element from the list of pending elements after an instruction has been popped off of the queue; and
  ii) assigning a next element in the list of pending elements as the head element.

19. A computer implemented method as in claim 12, wherein the step of determining whether an instruction comprising a head element of the queue has an associated delay which allows it to be presently popped from the queue comprises the step of returning a flag indicating that the queue is empty if either of the following conditions is met:

a) the head element is a NULL element; or b) the delay associated with the head element is greater than zero.

20. A computer implemented method as in claim 12, further comprising the step of determining whether the queue comprises elements associated with delays in excess of zero, and thus, whether the queue is devoid of instructions.

21. A computer implemented method as in claim 20, further comprising the step of adjusting, in response to data generated during the step of determining whether the queue is devoid of instructions, the delay associated with each instruction remaining on the queue, thereby ensuring that instructions remaining on the queue will be sequentially and immediately popped from the queue.

* * * * *